(12) United States Patent
Kimura et al.

(10) Patent No.: US 7,510,082 B2
(45) Date of Patent: Mar. 31, 2009

(54) WAFER STORAGE CONTAINER

(75) Inventors: Masayuki Kimura, Kitaibaraki (JP); Ryuichi Hirano, Kitaibaraki (JP); Hideki Kurita, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 148 days.

(21) Appl. No.: 11/596,681

(22) PCT Filed: Mar. 23, 2005

(86) PCT No.: PCT/JP2005/005196

§ 371 (c)(1), (2), (4) Date: Nov. 16, 2006

(87) PCT Pub. No.: WO2005/112106

PCT Pub. Date: Nov. 24, 2005

(65) Prior Publication Data

US 2007/0221519 A1     Sep. 27, 2007

(30) Foreign Application Priority Data

May 19, 2004  (JP) .............................. 2004-148910

(51) Int. Cl.
   *B65D 85/48*  (2006.01)
(52) U.S. Cl. ...................... 206/710; 206/454
(58) Field of Classification Search ................. 206/303, 206/454, 710, 722, 723, 724; 211/41.18
   See application file for complete search history.

(56) References Cited

U.S. PATENT DOCUMENTS 5,366,079 A  * 11/1994 Lin et al. .................. 206/710
6,848,579 B2 *  2/2005 Cleaver ..................... 206/454
6,988,620 B2 *  1/2006 Haggard et al. ............ 206/710

FOREIGN PATENT DOCUMENTS

| JP | 48-28953 | 9/1973 |
| JP | 61-200381 U | 12/1986 |
| JP | 63-180932 U | 11/1988 |
| JP | 1-169034 U | 11/1989 |
| JP | 3-102738 A | 4/1991 |
| JP | 6-204327 A | 7/1994 |
| JP | 11-111650 A | 4/1999 |
| JP | 2000-281172 A | 10/2000 |

* cited by examiner

*Primary Examiner*—Luan K Bui
(74) *Attorney, Agent, or Firm*—Birch, Stewart, Kolasch & Birch, LLP

(57) ABSTRACT

The present invention relates to a wafer storage container which contains a semiconductor wafer one by one and provides a technology to effectively reduce adhesion of particles on semiconductor wafer surfaces during the storage of the wafer. A wafer storage container which contains a wafer one by one, includes: a wafer containing member including a domed-shape recess which abuts on a circumferential edge of the wafer and is capable of holding the wafer; and a cover member which is engaged with the wafer containing member and is capable of sealing the wafer containing member; and a wafer rear surface protection member which is formed into a shape substantially same as an opening of the domed-shape recess and comes into contact with an entire rear surface of the wafer placed so that a front surface is directed the domed-shape recess.

7 Claims, 4 Drawing Sheets

(a)

(b)

WAFER STORAGE CONTAINER

This application is a 371 of PCT/JP05/05196, filed on Mar. 23, 2005.

TECHNICAL FIELD

The present invention relates to a wafer storage container for containing a semiconductor wafer one by one and specifically relates to a technology to reduce particles attached to surfaces of the semiconductor wafer during the storage of the wafer.

BACKGROUND ART

Generally, semiconductor wafers are stored or transported while the wafers are contained in wafer storage containers one by one because surfaces thereof are required to be kept clean.

For the above wafer storage containers, for example, a storage container disclosed in the Patent Literature 1 is used. FIG. 6 is a perspective view schematically showing a storage container of a semiconductor wafer, which is conventionally used, and FIG. 7 is a cross-sectional view thereof.

As shown in FIGS. 6 and 7, a wafer storage container 10 includes a wafer containing member 11 having a domed-shape recess 11a capable of holding a wafer W, a cover member 12, and a retainer member 13 which is disposed between the wafer W and the cover member 12.

The wafer containing member 11 and the cover member 12 are formed of, for example, polypropylene and are engaged with each other to seal a wafer containing section. The semiconductor wafer W is placed in the domed-shape recess 11a of the wafer containing member 11 in a state that a wafer surface W1 is directed downwardly and abuts on the domed-shape recess 11a at a circumferential edge to hold the wafer. Therefore, it is prevented that the other member is brought into contact with the wafer surface W1 and that particles are adhered to the wafer.

The retainer member 13 includes a plurality of leg sections 13b projecting outward from a center part 13a. The center part 13a and the leg sections 13b are formed to be curved as a whole. A cross-section crossing the center part 13a and each leg section 13b is arched. The retainer member 13 is shaped so that the displacement of the tip of each leg section 13b from the center part 13a is larger than the height of space formed between a wafer rear surface W2 and an inner wall 12a of the cover member 12 when the cover member 12 is engaged with the wafer containing member 11. Accordingly, when the wafer containing member 11 is engaged with the cover member 12, the cover member 12 presses the center part 13a, and the tips of the leg sections 13b press a circumferential edge of the wafer rear surface W2.

The semiconductor wafer is contained in the wafer storage container 10 having the aforementioned structure. However, the cover member 12 and the wafer containing member 11 are not sealed by a seal member or the like so as to be easily handled. Accordingly, particles cannot be completely prevented from entering from the engaging part. Moreover, particles sometimes remain in space inside the wafer storage container, or new particles are sometimes generated because of deterioration of the wafer storage container 10 itself.

When the semiconductor wafer contained in the wafer storage container is left for a long time, therefore, particles can be adhered to the front and rear surfaces of the semiconductor wafer in some cases. Accordingly, the wafer storage container for containing the wafer is generally packed with a laminate bag. The laminate bag is then evacuated, filled with inert gas, and sealed. The wafer storage container is thus blocked from coming into contact with outside air, so that external particles are prevented from entering the wafer storage container. Specifically, the wafer storage container which contains the semiconductor wafer is put into a laminate bag (for example, an aluminum laminate bag) having a high gas barrier property, and the laminate bag is put in a vacuum chamber. The vacuum chamber is then depressurized, and inert gas such as nitrogen is introduced into the chamber. The top of the laminate bag is subject to thermocompression bonding by a heater within the chamber to seal the laminate bag.

Patent Literature 1: Japanese Examined Patent Publication No. Sho 48-28953.

DISCLOSURE OF THE INVENTION

Problems to be Solved by the Invention

However, according to the aforementioned wafer storage method, there is low possibility that particles enter the wafer storage container after the wafer storage container is packed and sealed by the laminate bag. However, particles can enter while the wafer storage container is packed with the laminate bag. For example, when the wafer storage container is placed in the vacuum chamber, the vacuum chamber is depressurized by a vacuum pump, and inert gas is introduced to the chamber, not a small amount of air flow is generated. At this time, accordingly, it can be thought that particles enter the wafer storage container from the part where the cover member 12 and the wafer containing member 11 are engaged with each other.

The semiconductor wafer usually includes an orientation flat in the circumferential edge and is not a complete circle. Accordingly, particles having entered the wafer storage container go to the front surface side of the semiconductor wafer through gap between the semiconductor wafer and the domed-shape recess of the wafer containing section and are adhered to the wafer front surface in some cases. In such a case, when the semiconductor wafer is taken out of the wafer storage container and epitaxial growth or the like is directly performed for the front surface of the semiconductor wafer, abnormal growth or the like can be caused. It is therefore necessary to perform a process to clean the wafer front surface as a preparation process for the epitaxial growth, thus complicating the process.

It is therefore important to prevent particles from entering the storage container while the wafer storage container is packed with the laminate bag or prevent particles having entered the storage container from being adhered to the semiconductor wafer (especially on the front surface).

The present invention relates to a wafer storage container which contains a semiconductor wafer one by one, and an object of the present invention is to provide a technology of effectively reducing adhesion of particles on a front surface of the semiconductor wafer during the storage of the wafer.

Means for Solving the Problem

The present invention was made to solve the aforementioned problem. A wafer storage container for containing a wafer one by one, comprises: a wafer containing member comprising a domed-shape recess which abuts on a circumferential edge of the wafer and is capable of holding the wafer; a cover member which is engaged with the wafer containing member and is capable of sealing the wafer containing member; and a wafer rear surface protection member which is formed into a shape substantially same as an opening of the domed-shape recess and comes into contact with an entire rear surface of the wafer placed so that a front surface is directed to the domed-shape recess.

Accordingly, even if air flow is generated to allow particles to enter the wafer storage container while the semiconductor wafer W is contained in the wafer storage container, the wafer storage container is packed with a laminate bag, and air within the bag is substituted with inert gas, the particles are not adhered to the semiconductor wafer rear surface since the particles are captured by the wafer rear surface protection sheet. Moreover, the wafer rear surface protection member is formed into a shape substantially the same as the opening of the domed-shape recess of the wafer containing member. This prevents the particles having entered the wafer storage container from going to the wafer front surface side through the gap formed at the place of an orientation flat. Accordingly, particles are not adhered to the semiconductor wafer front surface.

Moreover, the wafer storage container further comprises a retainer member which is disposed between the wafer rear surface protection member and the cover member and pressed by the cover member to press the wafer against the wafer containing member when the wafer containing member and the cover member are engaged with each other. The retainer member can be, for example, a member having an arched cross section or a member including an elastic body sandwiched between the top and bottom thereof. At this time, part pressed by the retainer member may be either the entire surface of the rear surface protection member or a part of the rear surface protection member, such as the circumferential edge. The wafer can be therefore fixed to the wafer containing member while the adhesion between the wafer rear surface and the wafer rear surface protection member is increased.

Alternatively, the wafer rear surface protection member may have a function as a retainer member which is pressed by the cover member to press the wafer containing member when the wafer containing member and the cover member are engaged with each other. For example, such a retainer member can be implemented by including an elastic member such as a flat spring for a surface of the wafer rear surface protection member, which is opposite to a surface which comes into contact with the wafer.

Moreover, the wafer storage container further comprises a wafer front surface protection member which is disposed between the wafer and the wafer containing member, the wafer front surface protection member coming into contact with the domed-shape recess and abutting on the wafer circumferential edge. As for the front surface side of the semiconductor wafer, to prevent generation of particles due to friction or the like caused by contact between the wafer front surface and another member, the wafer circumferential edge is held by the domed-shape recess of the wafer containing member while the wafer surface is opened. However, space formed on the front surface side of the semiconductor wafer is therefore larger than that on the wafer rear surface side where the retainer member is usually inserted. Particles are therefore more likely to remain on the front surface side. By providing the wafer surface protection sheet, the size of the space formed between the semiconductor wafer and the domed-shape recess is reduced.

Furthermore, the wafer rear surface protection member and the wafer front surface protection member are formed of a material which is unlikely to generate particles such as polyethylene, polypropylene, polyester, and vinyl chloride. This can prevent particles from being generated from the protection members themselves and adhered to the semiconductor wafer.

The wafer rear surface protection member and the wafer front surface protection member are desirably formed of a material with a small amount of released gas, such as fluorine resin (for example, PTFE). Accordingly, degradation of the quality of the semiconductor wafer W due to contamination by out gas generated from the wafer protection members themselves can be avoided.

Effect of the Invention

According to the present invention, it is possible to effectively prevent the front and rear surfaces of the semiconductor wafer from being contaminated by adhesion of particles even if air flow is generated to allow particles to enter the wafer storage container while the semiconductor wafer is contained in the wafer storage container, the storage container is packed with the laminate bag, and air in the bag is substituted with inert gas. The surfaces of the semiconductor wafer can be thus maintained clean for a long time. Manufacturer of semiconductor wafers therefore can directly perform epitaxial growth for the surfaces of the semiconductor wafers after taking a semiconductor wafer out of the wafer storage container. This eliminates the need to perform a process to clean the wafer surfaces as a preparation process for the epitaxial growth, thus increasing the productivity.

EXPLANATION OF REFERENCE NUMERALS

10: WAFER STORAGE CONTAINER
11: WAFER CONTAINING MEMBER
11a: DOMED-SHAPE RECESS
12: COVER MEMBER
13: RETAINER MEMBER
13a: CENTER PART
13b: LEG SECTION
14: WAFER REAR SURFACE PROTECTION SHEET (WAFER REAR SURFACE PROTECTION MEMBER)
15: WAFER FRONT SURFACE PROTECTION SHEET (WAFER FRONT SURFACE PROTECTION MEMBER)

BEST MODE FOR CARRYING OUT THE INVENTION

Hereinafter, a description is given of preferred embodiments of the present invention based on the drawings.

FIRST EMBODIMENT

Figure 1:
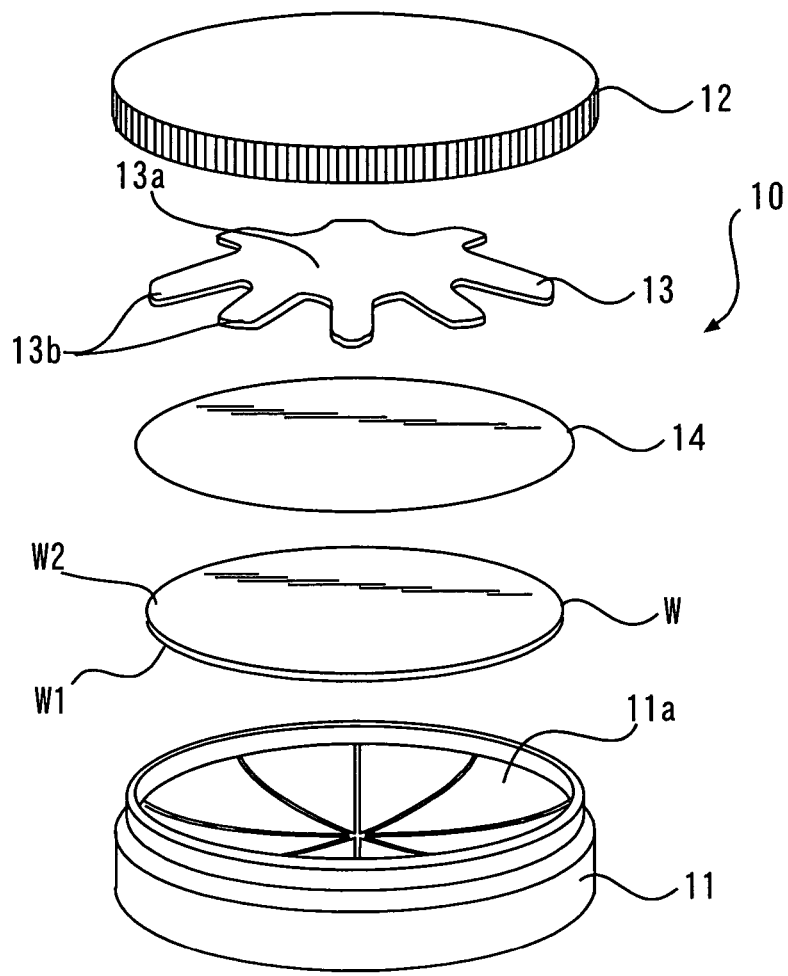
[FIG. 1] This is a perspective view schematically showing a semiconductor wafer storage container according to a first embodiment.
Figure 2:
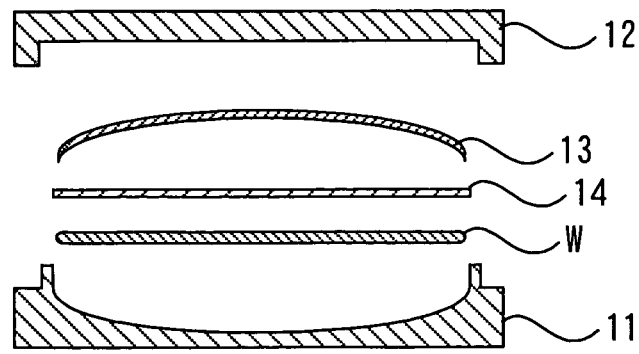
[FIG. 2] This is a cross-sectional view of the semiconductor wafer storage container according to the first embodiment.

FIG. 1 is a perspective view schematically showing a semiconductor wafer storage container according to a first embodiment, and FIG. 2 is a cross-sectional view of the same.

As shown in FIGS. 1 and 2, a wafer storage container 10 comprises a wafer containing member 11 having a domed-shape recess 11a capable of holding a wafer W, a cover member 12, and a retainer member 13 which is disposed between the wafer W and the cover member 12. In this embodiment, the wafer storage container 10 further comprises a wafer rear surface protection sheet 14 as a wafer rear surface protection member which is disposed between the wafer W and the retainer member 13 and brought into contact with an entire wafer rear surface W2 when the wafer is disposed so as to direct a wafer front surface W1 to the domed-shape recess 11a.

The wafer containing member 11 and the cover member 12 are formed of, for example, polypropylene and are engaged with each other to seal the wafer containing part. The semiconductor wafer W is placed in the domed-shape recess 11a of the wafer containing member 11 in a state that the wafer front surface W1 is directed downwardly and abuts on the domed-shape recess 11a at a wafer circumferential edge to hold the wafer.

The wafer rear surface protection sheet 14 is made of a fluorine resin film having a thickness of 100 μm. The wafer rear surface protection sheet 14 is formed into a shape substantially identical to an opening of the domed-shape recess 11a of the wafer containing member so that the entire opening of the domed-shape recess 11a is covered when the wafer rear surface protection sheet 14 is closely brought into contact with the entire semiconductor wafer rear surface W2. In other words, the gap generated between the semiconductor wafer W and the wafer containing member 11 by an orientation flat provided for the semiconductor wafer W. Moreover, since the wafer rear surface protection sheet 14 is formed of the fluorine resin film, few particles are generated from the protection sheet 14 itself. It is therefore possible to prevent adhesion of particles on the semiconductor wafer W. Moreover, since the fluorine resin film releases a small amount of gas, degradation of the quality of the semiconductor wafer W due to contamination by out gas from the wafer rear surface protection sheet 14 can be avoided.

The retainer member 13 includes a plurality of leg sections 13b protruding outward from the center part 13a. The center part 13a and the leg sections 13b are formed to be curved as a whole, and a cross section crossing the center part 13a and each leg section 13b is arched. The retainer member 13 is formed so that the displacement of the tip of each leg section 13b from the center part 13a is larger than height of space formed between the wafer rear surface W2 and inner wall 12a of the cover member 12 when the cover member 12 is engaged with the wafer containing member 11.

Accordingly, when the wafer containing member 11 is engaged with the cover member 12, the cover member 12 presses the center part 13a of the retainer member 13, and the tips of the leg sections 13b press the circumferential edge of the semiconductor wafer W via the wafer rear surface protection sheet 14.

The retainer member 13 having such an arched cross section is used in this embodiment. However, a member including an elastic body sandwiched between the top and bottom thereof can be used instead. Moreover, the retainer member may press a part of the rear surface protection sheet such as the circumferential edge like this embodiment or press the entire surface of the rear surface protection sheet. Especially in the case of using a retainer member pressing the entire surface of the rear surface protection sheet, the retainer member and the rear surface protection sheet may be previously bonded to each other.

According to the embodiment, even if air flow is generated to allow particles to enter the wafer storage container 10 while the semiconductor wafer W is contained in the wafer storage container 10, the wafer storage container 10 is packed with a laminate bag, and air within the bag is substituted with inert gas, the particles are not adhered to the semiconductor wafer rear surface W1 since the particles are captured by the wafer rear surface protection sheet 14. Moreover, even if there is a gap generated at a position of the orientation flat provided for the semiconductor wafer W, particles having entered the wafer storage container 10 cannot go to the wafer front surface side. Accordingly, no particles are adhered to the semiconductor wafer front surface W1.

The size of the wafer storage container 10 is not limited. The wafer storage container may be used according to the size of the contained semiconductor wafer W. For example, the diameter of the domed-shape recess 11a is a little larger than that of the semiconductor wafer W.

SECOND EMBODIMENT

Figure 3:
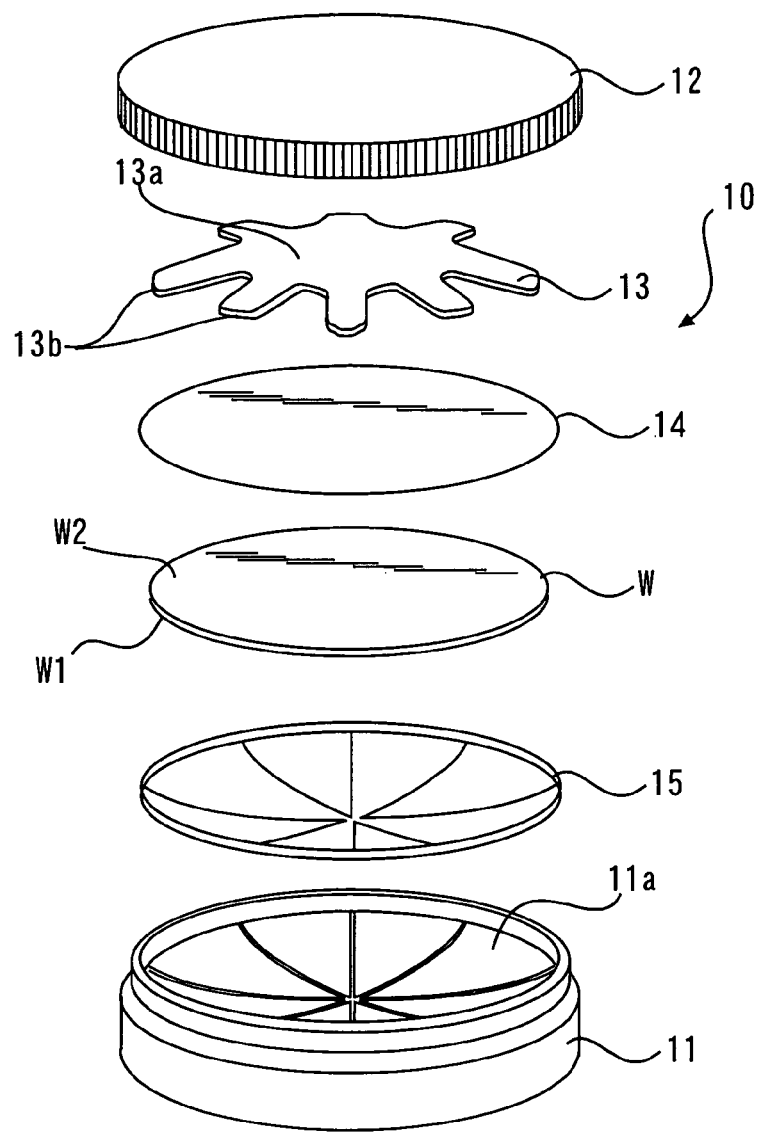
[FIG. 3] This is a perspective view schematically showing a semiconductor wafer storage container according to a second embodiment.
Figure 4:
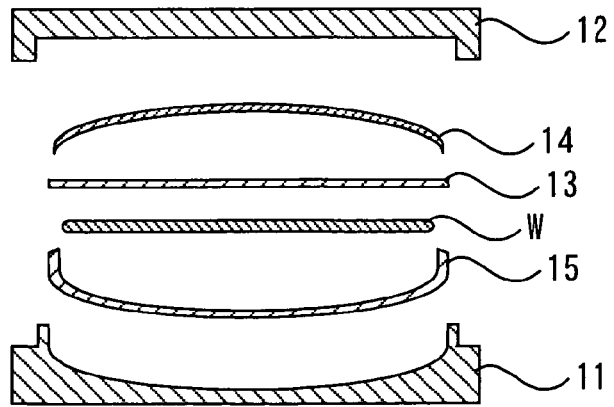
[FIG. 4] This is a cross-sectional view of the semiconductor wafer storage container according to the second embodiment.

FIG. 3 is a perspective view schematically showing a semiconductor wafer storage container according to a second embodiment, and FIG. 4 is a cross-sectional view of the same.

The configuration of the wafer storage container 10 according to the second embodiment is substantially the same as that of the first embodiment, and same members are given same reference numerals. The wafer storage container 10 of the second embodiment is different from that of the first embodiment in that a wafer front surface protection sheet 15 as a wafer front surface protection member is provided between the semiconductor wafer W and the domed-shape recess 11a when the semiconductor wafer is placed so that the semiconductor wafer front surface W1 is directed to the domed-shape recess 11a.

The wafer front surface protection sheet 15 is made of a fluorine resin film with a thickness of 200 μm which is similar to the wafer rear surface protection sheet. The wafer front surface protection sheet 15 has a shape which is substantially the same as the inner wall of the domed-shape recess 11a and comes into contact with the domed-shape recess 11a. The space formed between the semiconductor wafer W and the domed-shape recess 11a is thus configured to be as small as possible. The thickness of the wafer front surface protection sheet 15 is not particularly limited. However, the wafer front surface protection sheet is desirably thick enough to keep a capability of holding the semiconductor wafer W.

Specifically, as for the front surface side of the semiconductor wafer W, to prevent generation of particles due to friction or the like caused by contact between the wafer front surface W1 and another member, the wafer circumferential edge is held by the domed-shape recess 11a of the wafer containing member 11 while the wafer surface W1 is opened. Space formed on the front surface side of the semiconductor wafer W is thus larger than that on the wafer rear surface side where the retainer member 13 is inserted. More particles are therefore likely to remain on the front surface side, and particles are comparatively easily adhered to the wafer front surface. By providing the wafer surface protection sheet 15, the size of the space formed between the semiconductor wafer W and the domed-shape recess 11a is reduced so that remaining particles in the above space are reduced.

According to this embodiment, the space between the semiconductor wafer W and the domed-shape recess 11a is smaller than that in the conventional wafer storage container. Accordingly, there is low possibility that particles remain on the front surface side of the semiconductor wafer W. The front surface of the semiconductor wafer W can be therefore maintained cleaner.

The following is result of measurements in which the wafer storage containers 10 according to the aforementioned first and second embodiments were used; and amounts of particles on the wafer front and rear surfaces were measured before and after each wafer storage container 10 was packed with the laminate bag and air within the bag was substituted with inert gas (for example, nitrogen).

Specifically, first, the amounts of particles on the semiconductor wafer front and rear surfaces were measured (the amounts of particles before packing); the measured semiconductor wafers were contained in each wafer storage container; and the wafer storage container was put in the aluminum laminate bag. The laminate bag was put in a vacuum chamber, and the chamber is depressurized. Thereafter, inert gas such as nitrogen was introduced to the chamber, and the top of the laminate bag was subject to thermocompression bonding by a heater within the chamber to seal the laminate bag. Next, after the wafer storage container was left in such a state for several hours (for example, three hours), the laminate bag was opened, and the semiconductor wafer was taken out of the wafer storage container. The amounts of particles on the wafer front and rear surfaces were then measured (the amounts of particles after packing). Herein, particles on the wafer front surface were measured using a particle inspection system, and particles on the wafer rear surface were visually observed.

Figure 5:
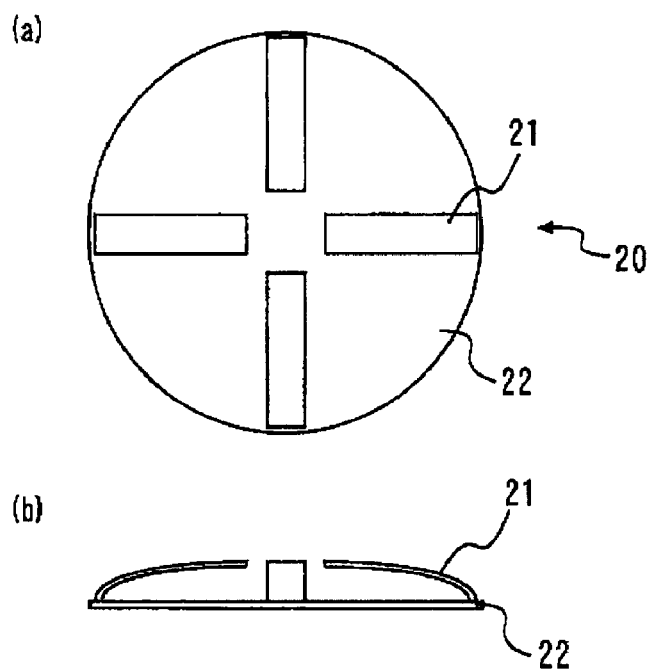
[FIG. 5] This is an example of a wafer rear surface protection member having a function as a retainer member.
Figure 6:
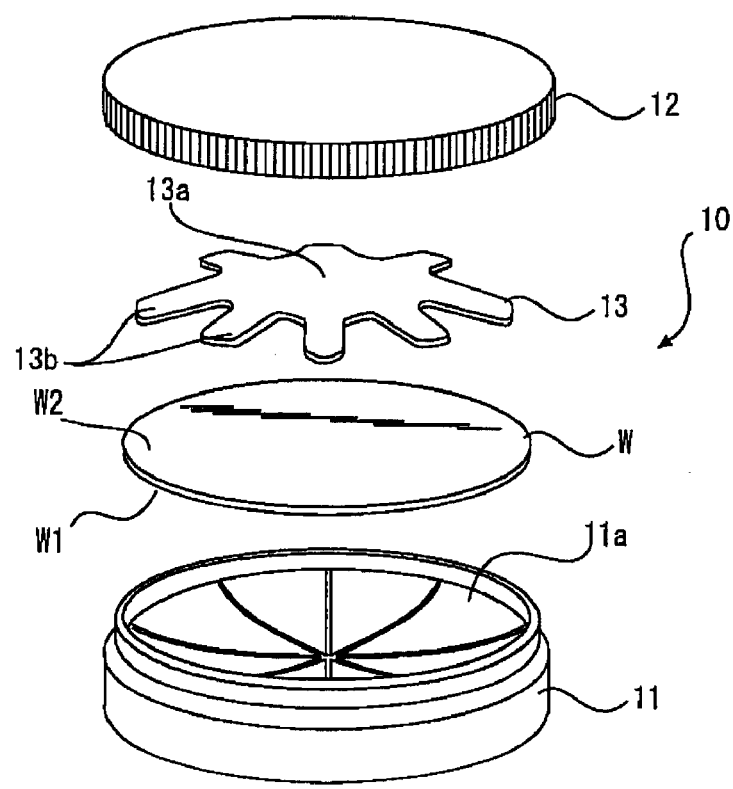
[FIG. 6] This is a perspective view schematically showing a conventional wafer storage container.
Figure 7:
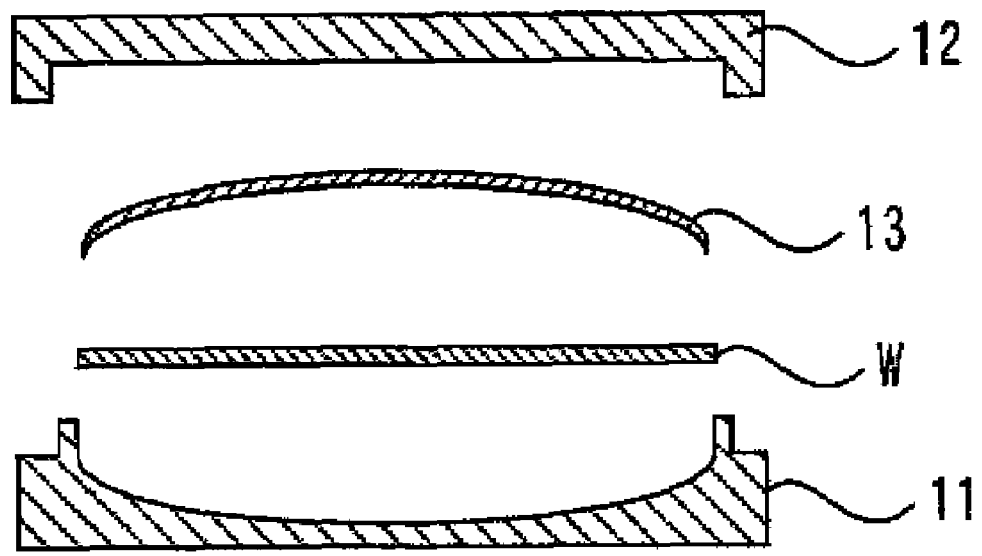
[FIG. 7] This is a cross-sectional view of the conventional wafer storage container.

As the semiconductor wafers, 2-inch diameter InP semiconductor wafers were used. The measurement was performed for a plurality of the 2-inch diameter InP semiconductor wafers. Moreover, as a comparative example, the same measurement was performed using the conventional wafer storage container (see FIGS. 5 and 6).

Table 1 shows averages of particle density obtained by the measurement of particles on the wafer front surfaces of fifty InP semiconductor wafers by the particle inspection system. The particle density was obtained for particles having a size of 0.3 μm or more.

As shown in Table 1, in the comparative example, the wafer front surface particle density increased after packing by 0.16 particles/cm$^2$ as compared to before packing. On the other hand, in the case of using the wafer storage container according to the first embodiment, in which only the rear surface protection sheet 14 is provided, the wafer front surface particle density increased after packing only by 0.04 particles/cm$^2$. This shows that the wafer rear surface protection sheet 14 can efficiently prevent particles having entered during the substitution of inert gas from being adhered to the wafer front surface. Furthermore, in the case of using the wafer storage container according to the second embodiment, in which the wafer front surface protection sheet 15 is further provided, there was no change in the wafer front surface particle density observed before and after packing. This shows that particles entering during the substitution of the inert gas can be substantially completely prevented from being adhered to the wafer front surface.

TABLE 1

| | Before packing (particles/cm$^2$) | After packing (particles/cm$^2$) |
|---|---|---|
| First Embodiment (Rear Surface Protection Sheet) | 0.55 | 0.59 |
| Second Embodiment (Rear and Front Surface Protection Sheets) | 0.48 | 0.48 |
| Comparative Example | 0.52 | 0.68 |

Table 2 shows averages of particle density obtained by measurement of particles on the wafer rear surfaces of twenty InP semiconductor wafers by visual observation. The particle density was measured for particles having a size of 0.1 mm or more. Herein, since the particles adhered to the rear surface of a semiconductor wafer do not have much effect on the quality of the semiconductor wafers, it was thought that the particles adhered to the wafer rear surface were unnecessary to be evaluated as strictly as particles adhered to the wafer front surface and were visually observed.

As shown in Table 2, in the comparative example, the number of particles on the wafer rear surface increased after packing by 1.3 particles/wafer as compared to before packing. On the other hand, in the cases of using the wafer storage container according to the first embodiment, in which only the rear surface protection sheet 14 is provided, and the wafer storage container according to the second embodiment, no change was observed in the number of particles on the wafer rear surface before and after packing. This shows that the wafer rear surface protection sheet 14 can substantially completely prevent particles entering during the substitution of inert gas from being adhered to the wafer rear surface.

TABLE 2

| | Before Packing (particles/wafer) | After Packing (particles/wafer) |
|---|---|---|
| First Embodiment (Rear Surface Protection Sheet) | 1.8 | 1.8 |
| Second Embodiment (Rear and Front Surface Protection Sheets) | 1.6 | 1.6 |
| Comparative Example | 1.5 | 2.8 |

As described above, in accordance with the wafer storage container according to the present invention, it is possible to effectively prevent the front and rear surfaces of the semiconductor wafer from being contaminated by adhesion of particles even if air flow is generated to allow particles to enter the wafer storage container while the semiconductor wafer is contained in the wafer storage container, the storage container is packed with the laminate bag, and air in the bag is substituted with inert gas. The surfaces of the semiconductor wafer can be thus maintained clean for a long time. Manufacturer of semiconductor wafers can therefore directly perform epitaxial growth for the surfaces of the semiconductor wafers after taking a semiconductor wafer out of the wafer storage container. This eliminates the need to perform a process to clean the wafer surfaces as a preparation process for the epitaxial growth, thus increasing the productivity.

Hereinabove, the present invention made by the inventor was specifically described based on the embodiments. The present invention is not limited by the aforementioned embodiments, and various changes can be made without departing from the gist of the invention.

For example, in the aforementioned embodiments, the wafer rear protection sheet 14 and the wafer front surface protection sheet 15 are formed of the fluorine resin film such as a PTFE film. However, the material thereof is not limited to this and may be a material which is unlikely to generate particles such as polyethylene, polypropylene, polyester, or vinyl chloride.

Moreover, the shape of the retainer member is not limited to one described in the aforementioned embodiments. For example, as show in FIG. 5, the wafer rear surface protection member 20 may be configured to serve as a retainer member by providing an elastic member 21 such as a flat spring for a surface of the wafer rear surface protection member 22 which is opposite to a surface coming into contact with the wafer.

Moreover it is obvious that the type of the semiconductor wafer to be contained is not limited and the present invention can be applied to a storage container for a semiconductor wafer other than the InP semiconductor wafer.

The invention claimed is:

1. A wafer storage container for containing a wafer one by one, comprising:
    a wafer containing member comprising a domed-shape recess which abuts on a circumferential edge of the wafer and is capable of holding the wafer;
    a cover member which is engaged with the wafer containing member and is capable of sealing the wafer containing member;
    a wafer rear surface protection member which is formed into a shape substantially the same as an opening of the domed-shape recess and comes into contact with an entire rear surface of the wafer placed so that a front surface is directed to the domed-shape recess; and
    a wafer front surface protection member having a shape substantially the same as that of an inner wall of the domed-shape recess, the wafer front surface protection member coming into contact with the domed-shape recess and abutting only on the wafer circumferential edge.

2. The wafer storage container as claimed in claim 1, further comprising: a retainer member which is disposed between the wafer rear surface protection member and the cover member and pressed by the cover member to press the wafer against the wafer containing member when the wafer containing member and the cover member are engaged with each other.

3. The wafer storage container as claimed in claim 1, wherein the wafer rear surface protection member has a function as a retainer member which is pressed by the cover member to press the wafer containing member when the wafer containing member and the cover member are engaged with each other.

4. The wafer storage container as claimed in claim 1, wherein the wafer rear surface protection member is formed of a material which is unlikely to generate particles.

5. The wafer storage container as claimed in claim 1, wherein the wafer rear surface protection member is formed of a material with a small amount of released gas.

6. The wafer storage container as claimed in claim 4, wherein the material which is unlikely to generate particles includes any one of polyethylene, polypropylene, polyester, and vinyl chloride.

7. The wafer storage container as claimed in claim 5, wherein the material with a small amount of released gas includes a fluorine resin film.

* * * * *